US012021081B2

(12) United States Patent
Glass et al.

(10) Patent No.: US 12,021,081 B2
(45) Date of Patent: *Jun. 25, 2024

(54) TECHNIQUES FOR ACHIEVING MULTIPLE TRANSISTOR FIN DIMENSIONS ON A SINGLE DIE

(71) Applicant: INTEL CORPORATION, Santa Clara, CA (US)

(72) Inventors: Glenn A. Glass, Portland, OR (US); Anand S. Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 290 days.

This patent is subject to a terminal disclaimer.

(21) Appl. No.: 17/468,522

(22) Filed: Sep. 7, 2021

(65) Prior Publication Data

US 2021/0398979 A1    Dec. 23, 2021

Related U.S. Application Data

(63) Continuation of application No. 16/050,590, filed on Jul. 31, 2018, now Pat. No. 11,152,361, which is a
(Continued)

(51) Int. Cl.
*H01L 27/092* (2006.01)
*H01L 21/3065* (2006.01)
(Continued)

(52) U.S. Cl.
CPC ...... *H01L 27/0924* (2013.01); *H01L 21/3065* (2013.01); *H01L 21/3081* (2013.01);
(Continued)

(58) Field of Classification Search
CPC ............. H01L 27/0924; H01L 21/3065; H01L 21/3081; H01L 21/823807;
(Continued)

(56) References Cited

U.S. PATENT DOCUMENTS 7,005,366 B2   2/2006  Chau et al.
7,358,121 B2   4/2008  Chau et al.
(Continued)

FOREIGN PATENT DOCUMENTS

CN      1897232      1/2007
CN    103325736      9/2013
(Continued)

OTHER PUBLICATIONS

Office Action from Korean Patent Application No. 10-2023-7033359, mailed Aug. 18, 2023, 4 pgs.
(Continued)

*Primary Examiner* — Karen Kusumakar
*Assistant Examiner* — Adam S Bowen
(74) *Attorney, Agent, or Firm* — Schwabe, Williamson & Wyatt P.C.

(57) ABSTRACT

Techniques are disclosed for achieving multiple fin dimensions on a single die or semiconductor substrate. In some cases, multiple fin dimensions are achieved by lithographically defining (e.g., hardmasking and patterning) areas to be trimmed using a trim etch process, leaving the remainder of the die unaffected. In some such cases, the trim etch is performed on only the channel regions of the fins, when such channel regions are re-exposed during a replacement gate process. The trim etch may narrow the width of the fins being trimmed (or just the channel region of such fins) by 2-6 nm, for example. Alternatively, or in addition, the trim may reduce the height of the fins. The techniques can include any number of patterning and trimming processes to enable a variety of fin dimensions and/or fin channel dimensions on a given die, which may be useful for integrated circuit and system-on-chip (SOC) applications.

20 Claims, 8 Drawing Sheets

Related U.S. Application Data continuation of application No. 15/115,852, filed as application No. PCT/US2014/031599 on Mar. 24, 2014, now Pat. No. 10,141,311.

(51) Int. Cl.
  *H01L 21/308* (2006.01)
  *H01L 21/8238* (2006.01)
  *H01L 29/66* (2006.01)
  *H01L 29/78* (2006.01)

(52) U.S. Cl.
  CPC ............. *H01L 21/823807* (2013.01); *H01L 21/823821* (2013.01); *H01L 29/66545* (2013.01); *H01L 29/66818* (2013.01); *H01L 29/785* (2013.01)

(58) Field of Classification Search
  CPC ....... H01L 21/823821; H01L 29/66545; H01L 29/66818; H01L 29/785; H01L 29/0673; H01L 29/66439; H01L 29/775; H01L 27/0886; B82Y 10/00
  See application file for complete search history.

(56) References Cited

U.S. PATENT DOCUMENTS

| | | | |
|---|---|---|---|
| 7,368,791 | B2 | 5/2008 | Zhang |
| 8,441,074 | B2 | 5/2013 | Rachmady et al. |
| 2004/0036126 | A1 | 2/2004 | Chau et al. |
| 2005/0199949 | A1 | 9/2005 | Chau et al. |
| 2007/0029624 | A1 | 2/2007 | Nowak |
| 2007/0034972 | A1 | 2/2007 | Chau et al. |
| 2007/0161171 | A1 | 7/2007 | Burnett et al. |
| 2010/0144121 | A1 | 6/2010 | Chang et al. |
| 2010/0213548 | A1 | 8/2010 | Chang |
| 2011/0260253 | A1 | 10/2011 | Inaba |
| 2012/0180016 | A1 | 7/2012 | Chidambaram |
| 2012/0292715 | A1 | 11/2012 | Hong et al. |
| 2013/0037886 | A1* | 2/2013 | Tsai ................ H01L 21/845 438/231 |
| 2013/0049136 | A1 | 2/2013 | Wahl |
| 2013/0093026 | A1 | 4/2013 | Wann et al. |
| 2013/0105867 | A1 | 5/2013 | Wann et al. |
| 2013/0119482 | A1 | 5/2013 | Wann et al. |
| 2013/0196508 | A1 | 8/2013 | LiCausi |
| 2013/0244392 | A1 | 9/2013 | Oh |
| 2013/0313610 | A1 | 11/2013 | Sell |
| 2014/0042500 | A1 | 2/2014 | Wann et al. |
| 2014/0061817 | A1 | 3/2014 | Gan |
| 2014/0077332 | A1 | 3/2014 | Vincent |
| 2014/0117462 | A1 | 5/2014 | Cheng |
| 2014/0239255 | A1 | 8/2014 | Kang |
| 2015/0243755 | A1 | 8/2015 | Cheng |
| 2017/0133377 | A1 | 5/2017 | Glass et al. |

FOREIGN PATENT DOCUMENTS

| | | |
|---|---|---|
| KR | 10-2005-0065908 | 6/2005 |
| KR | 1020130106091 | 9/2013 |
| TW | 200414538 | 1/2008 |
| TW | 201340186 | 10/2013 |
| TW | 201342485 | 10/2013 |
| TW | 201344886 | 11/2013 |
| TW | 201407786 | 2/2014 |
| TW | 201409581 | 3/2014 |
| WO | WO 2015147783 | 10/2015 |

OTHER PUBLICATIONS

Notice of Allowance from Taiwan Patent Application No. 109121328, dated Mar. 1, 2022, 3 pgs.
Office Action from Korean Patent Application No. 10-2021-7026728, dated May 12, 2022, 4 pgs.
Office Action and Search Report received for TW Application No. 109121328, dated Aug. 20, 2021, 6 pgs.
Notice of Allowance from Korean Patent Application No. 10-2020-7033531, dated Feb. 10, 2022, 3 pgs.
Office Action received for Korean Patent Application No. 10-2016-7022710, Issued by the Korean Intellectual Patent Office, mailed Mar. 6, 2020.
Malaysia Examination Report received for Malaysian Application No. PI 2016703058, dated Sep. 8, 2019, 3 pages.
Office Action and Search Report received for TW Application No. 107122648, dated Dec. 17, 2018. 20 pages.
International Search Report and Written Opinion received in PCT Application No. PCT/US14/031599. Date of Mailing Dec. 19, 2014, 13 pages.
Office Action and Search Report received for TW Application No. 104103726 dated Feb. 15, 2016. 7 pages; including 4 pages of English translation.
Office Action and Search Report received for TW Application No. 105124616 dated Jan. 5, 2017. 10 pages.
Extended European Search Report received for EP Application No. 14887004.1, dated Nov. 2, 2017. 7 pages.
Office Action and Search Report received for TW Application No. 106117038 dated Sep. 4, 2017. 22 pages.
Office Action for European Patent Application No. 14887004.1 mailed Dec. 8, 2020, 5 pgs.
Office Action from Korean Patent Application No. 10-2020-7033531, mailed Jan. 6, 2021, 8 pgs.
Notice of Allowance from Korean Patent Application No. 10-2020-7033531, mailed Jul. 21, 2021, 4 pgs.
Office Action for Chinese Patent Application No. 201480076296.3 mailed Dec. 3, 2018, 8 pgs., no translation.
Final Office Action for Chinese Patent Application No. 201480076296.3 mailed Jun. 10, 2019, 6 pgs., no translation.
Notice of Allowance for Chinese Patent Application No. 201480076296.3 mailed Nov. 27, 2019, 4 pgs.
Office Action received for Korean Patent Application No. 10-2016-7022710, Issued by the Korean Intellectual Patent Office, mailed Oct. 10, 2020, 5 pgs., with English translation.
Office Action and Search Report received for TW Application No. 107122648, dated Jul. 8, 2019. 4 pgs., with English translation.
Office Action from Korean Patent Application No. 10-2021-7026728, dated Sep. 13, 2022, 5 pgs., with English translation.
Office Action from Korean Patent Application No. 10-2021-7026728, dated Jun. 27, 2023, 17 pgs.
Office Action from Korean Patent Application No. 10-2020-7033531, dated Sep. 17, 2021, 5 pgs.
Office Action from Korean Patent Application No. 10-2021-7026728, dated Nov. 24, 2021, 6 pgs.
Office Action from Taiwan Application No. 112123209, dated Nov. 17, 2023, 5 pgs.
Office Action from U.S. Appl. No. 18/088,463, mailed Dec. 6, 2023, 15 pgs.
Office Action from Korean Patent Application No. 10-2022-7043638, mailed Feb. 22, 2024, 5 pgs.
Notice of Allowance from U.S. Appl. No. 18/088,463, mailed Mar. 22, 2024, 8 pgs.

* cited by examiner

TECHNIQUES FOR ACHIEVING MULTIPLE TRANSISTOR FIN DIMENSIONS ON A SINGLE DIE

CROSS-REFERENCE TO RELATED APPLICATION

This patent application is a continuation of U.S. patent application Ser. No. 16/050,590, filed Jul. 31, 2018, which is a continuation of U.S. patent application Ser. No. 15/115,852, filed Aug. 1, 2016, now U.S. Pat. No. 10,141,311, issued Nov. 27, 2018, which is a U.S. National Phase Application under 35 U.S.C. § 371 of International Application No. PCT/US2014/031599, filed Mar. 24, 2014, entitled "TECHNIQUES FOR ACHIEVING MULTIPLE TRANSISTOR FIN DIMENSIONS ON A SINGLE DIE," which designates the United States of America, the entire disclosure of which are hereby incorporated by reference in their entirety and for all purposes.

BACKGROUND

Integrated circuit (IC) design, especially highly integrated system-on-chip (SOC) devices, involve a number of non-trivial issues, and transistor structures have faced particular complications, such as those with respect to achieving devices with low-power dissipation side-by-side with high performance devices. Finned transistor configurations include a transistor built around a thin strip of semiconductor materials (generally referred to as the fin). The transistor includes the standard field effect transistor (FET) nodes, including a gate, a gate dielectric, a source region, and a drain region. The conductive channel of the device effectively resides on the outer sides of the fin, beneath the gate dielectric. Specifically, current runs along/within both sidewalls of the fin (sides substantially perpendicular to the substrate surface) as well as along the top of the fin (side substantially parallel to the substrate surface). Because the conductive channel of such configurations essentially resides along the three different outer, planar regions of the fin, such configurations have been termed as finFET and tri-gate transistors. Other types of finned configurations can also be used, such as so-called double-gate finFETs, in which the conductive channel principally resides only along the two sidewalls of the fin (and not along the top of the fin, for example).

BRIEF DESCRIPTION OF THE DRAWINGS

FIGS. 7C and 8 may also be viewed as cross-sections taken at different locations of the same two fins post trim etch, in accordance with an embodiment.

DETAILED DESCRIPTION

Figure 1:
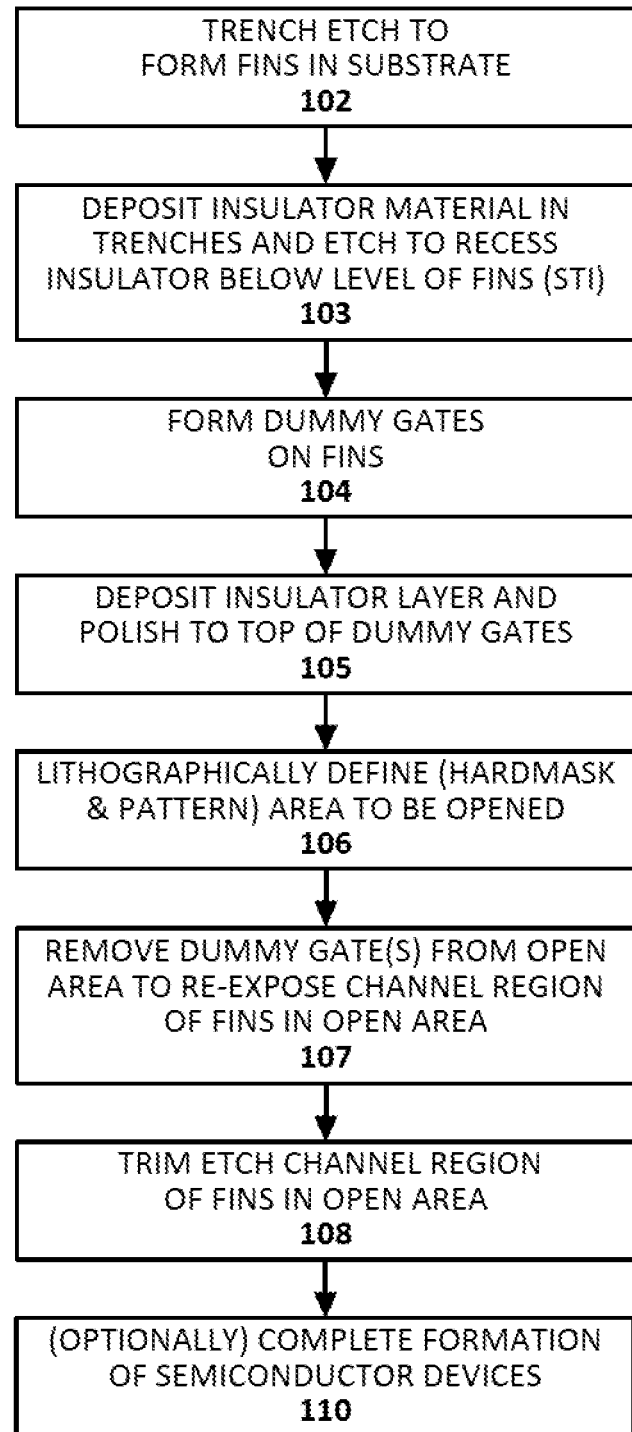
FIG. 1 shows a method of forming an integrated circuit structure including multiple fin channel dimensions, in accordance with one or more embodiments of the present disclosure.

Techniques are disclosed for achieving multiple fin dimensions on a single die or semiconductor substrate, and even on a single continuous fin structure. In some cases, multiple fin dimensions are achieved by lithographically defining (e.g., hardmasking and patterning) areas to be trimmed using a trim etch process, leaving the remainder of the die (and other portions of a given fin structure) unaffected. In some such cases, the trim etch is performed on only the channel regions of a given set of fins (one or more fins), when such channel regions are re-exposed during a replacement gate process. The trim etch may include, for instance, low ion energy plasma processing or thermal processing, and it may narrow the width of the fins being trimmed (or just the channel region of such fins) by 2-6 nm, for example. Alternatively, or in addition, the trim may reduce the height of the fins. The techniques can include any number of patterning and trimming processes to enable a variety of fin dimensions and/or fin channel dimensions on a given die, which may be useful for integrated circuit and system-on-chip (SOC) applications. Numerous configurations and variations will be apparent in light of this disclosure.

General Overview

As previously explained, there are a number of non-trivial issues associated with fabricating integrated circuits, and especially system-on-chip (SOC) devices. For highly integrated SOC devices, the requirements for transistor performance are typically varied for different portions of the chip. Logic areas may require very low leakage for longer battery life, while power management areas may require high current to actuate other systems in the package. These divergent requirements are difficult to meet with a single transistor type. In the context of planar transistor device architecture, these issues are commonly solved with different gate and channel dimensions. In the context of finned transistor device architecture (e.g., tri-gate or finFET architectures), the channel dimensions are typically determined by a spacer patterning technique that is limited to a single fin height/width dimension (and thereby a single height/width in the channel region of the fin) on a given die.

Thus, and in accordance with one or more embodiments of the present disclosure, techniques are provided for achieving multiple fin dimensions on a single die, and even on a single continuous fin. In some embodiments, multiple fin dimensions are achieved by lithographically defining (e.g., hardmasking and patterning) areas to be trimmed and then performing a trim etch on only those areas, leaving the remainder of the fin and die (e.g., the areas that were not patterned) unaffected. In some such embodiments, the trim etch is performed on only the channel regions of the lithographically defined area, when such channel regions are re-exposed during a replacement gate process, for example. The trim etch may include, for instance, low ion energy plasma processing (e.g., using Cl based chemistry) or thermal processing (e.g., using HCl or Cl2). The techniques can include any number of patterning and trimming processes to enable a variety of fin dimensions and/or fin channel dimensions on a given die, which may be useful for integrated circuit and system-on-chip (SOC) applications.

As will be apparent in light of this disclosure, the fins being trimmed on a given die (e.g., a first set of one or more fins) may have an initial/first width (W1) before trim etch greater than 10 nm (e.g., 15, 20, or 30 nm). After trim etch, those fins being trimmed may have a second width (W2) of 15 nm or below (e.g., 15, 10, or 7 nm). In some embodiments, only the channel region of the fins may be trimmed (e.g., during a replacement gate process), resulting in the trimmed fins each having a narrower channel region relative to the source/drain regions of the same fins. In some cases, the trim etch may cause a narrowing of the fin by 2-6 nm. In some embodiments, it may be desirable to reduce the height of the fins as little as possible while performing the trim etch to narrow the width of the fins. For example, it may be desirable to ensure trimmed fins have a trimmed height of 20 nm or more above the trench oxide plane. Therefore, in some embodiments, it may be desirable to start off with a high initial fin height (e.g., greater than 25, 30, 50, or 75 nm). In some embodiments, the width and/or height of trimmed fins may be reduced by a desired percentage, such as 10, 15, 20, or 25%, or some other suitable percentage based on the desired application. Reducing the fin width in the channel region can make it easier to electronically invert the channel by application of gate bias and reduce carrier leakage when the gate is not biased. In the remaining untrimmed/unaffected fins (e.g., a second set of fins), the fins may have a third width (W3), which may be equal to or substantially similar to W1.

Note that change in fin height in some circumstances may be unintentional or otherwise unavoidable and planned for accordingly. For instance, in some such cases, the change in fin height is effectively a byproduct of width trimming procedures. Yet in other embodiments, however, the fin height may be intentionally changed to provide a specific fin height. In such embodiments, multiple fin heights can be achieved on a single die and/or multiple transistor finned channel heights can be achieved, for example. For instance, in a CMOS application it may be useful to provide multiple fin height values along the same fin, such as a first fin height of 30 nm for p-type transistors and a second fin height of 20 nm for n-type transistors.

So, depending on the application and desired circuit performance, a single die can have multiple transistor geometries. Some of those transistors may have a first fin width in the channel region while others of those transistors may have a second fin width in the channel region, or a third fin width and so on. Likewise, some of those transistors may have a first fin height in the channel region while others of those transistors may have a second fin height in the channel region, or a third fin height and so on. To this end, each transistor device on that die can be configured as needed for a given application, and may have any suitable geometry (width/height combination). In some example embodiments, the diverse transistor geometries are on the same fin, while in other embodiments a first transistor geometry is provided in a first location on the die and a second transistor geometry is provided in a second location on the die, and so on. In still other embodiments, a single die can be configured with different fin sets having different transistor geometries as well as one or more single fins having diverse transistor geometries.

Recall that any number of patterning and trimming processes can be performed to enable a variety of fin dimensions or fin channel dimensions on a given die. For example, if a second sequence of patterning and trimming is performed, a third set of fins can be produced having fin dimensions that may differ from the first two sets, and so on. Note that a set of fins as used herein includes one or more fins. After forming multiple sets of fins having differing dimensions (or at least differing dimensions among the channel region of the sets of fins), various semiconductor devices (e.g., transistors) can be formed on the fins, including finned metal-oxide-semiconductor (MOS) transistor devices (e.g., tri-gate or finFET devices). Such MOS transistor devices may include n-type MOS devices (n-MOS), and p-type MOS devices (p-MOS), and complementary MOS devices (CMOS).

Upon analysis (e.g., scanning electron microscopy and/or composition mapping), a structure configured in accordance with one embodiment will effectively show multiple fin dimensions and/or multiple fin channel dimensions on a given die or even on a given single continuous fin. In some embodiments, only the channel region of a set of fins may be trimmed and thus have a narrower width relative to the source/drain regions of the set of fins and relative to the channel region of another set of fins on the given die. For example, the techniques described herein may create a first set of fins formed on and from a given substrate/die, where the first set of fins each have a first width (W1) in the source/drain regions and a second width (W2) in the channel region, such that W2 is less than W1. Further, the given substrate/die may have a second set of fins, where the second set of fins each have a third width (W3) in the source/drain regions and the channel region (e.g., having a consistent width in all three regions of the fin). In such an example case, W3 may be equal to or substantially similar to W1, since these regions would be unaffected by any trim etch performed, as will be described herein. Therefore, the widths W1, W2, and W3 can be inspected and compared.

Further, in some cases, integrated circuits fabricated using the techniques described herein (e.g., from a single substrate/die) can provide an improvement over conventional structures with respect to, at least, providing different transistor performance sections based on the location of the transistors on the given substrate/die. For example, an area of the integrated circuit die may include a first set of fins formed at one location on the die and having channel dimensions suitable for low leakage/longer battery life applications (e.g., logic areas), and a second set of fins formed at another location on the die and having channel dimensions suitable for high current applications (e.g., power management areas). As will be further appreciated in light of this disclosure, such geometrically diverse transistor areas of the die may also be formed on the same continuous fin. Therefore, integrated circuits including multiple fin dimensions or multiple fin channel dimensions as variously described herein may be useful for system-on-chip (SOC) applications, especially highly integrated SOC applications. Numerous configurations and variations will be apparent in light of this disclosure.

Methodology and Architecture

FIG. 1 shows a method 101 of forming an integrated circuit structure including multiple fin channel dimensions, in accordance with one or more embodiments of the present disclosure. As will be apparent in light of this disclosure, trimming/sculpting (e.g., using a trim etch as variously described herein) to achieve different fin channel dimensions is described herein in the context of a replacement gate process, such as a replacement metal gate (RMG) process. However, in some embodiments, the trimming/sculpting may be performed before gate (or dummy gate) deposition, to trim each fin in both the source/drain regions and the channel regions, as will be discussed in more detail below. FIGS. 2-9 illustrate example structures that are formed as the process flow or method 101 of FIG. 1 is carried out, in accordance with some embodiments. Although method 101 of FIG. 1 and the structures shown in FIGS. 2-9 are depicted and described herein in the context of forming finned transistor configurations (e.g., tri-gate or finFET) having varying channel dimensions, similar principles and techniques as variously described herein may be used for other transistor configurations, including, for example, planar, dual-gate, gate-all-around (e.g., nanowire/nanoribbon), and other suitable semiconductor devices and configurations, as will be apparent in light of this disclosure.

Figure 2:
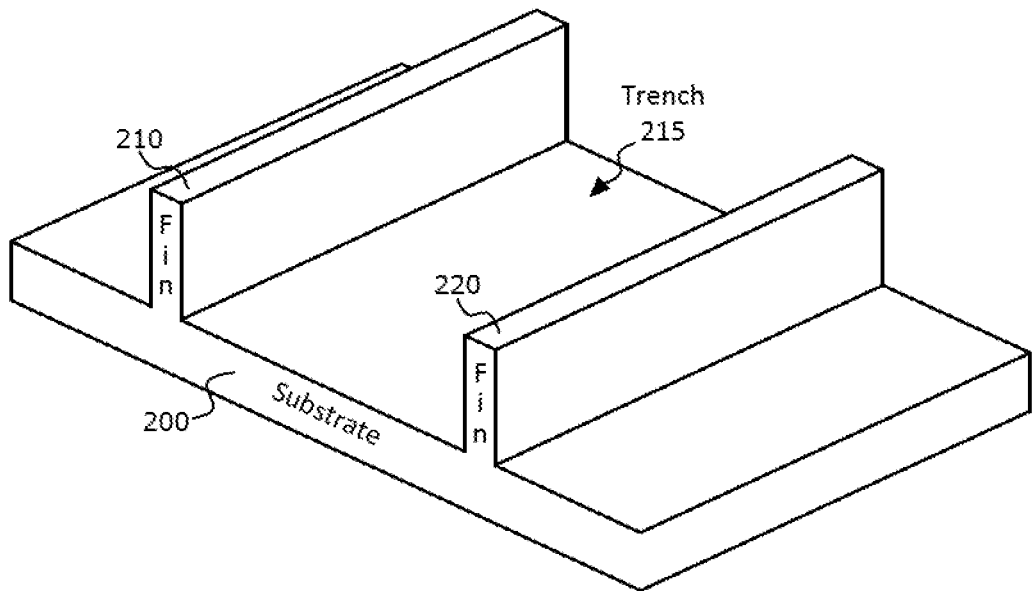
FIG. 2 illustrates a perspective view of a semiconductor substrate including fins after a trench etch was performed to form the fins in the substrate, in accordance with an embodiment.

FIG. 2 illustrates a perspective view of semiconductor substrate 200 including fins 210 and 220 after trench etch 102 was performed to form fins 210 and 220 in substrate 200, in accordance with an embodiment. In some cases, method 101 may include initially providing substrate 200 such that trench etch 102 can be performed on the provided substrate 200. Substrate 200 may include, be formed from, deposited with, or grown from silicon, polycrystalline silicon, or single crystal silicon, for example. Substrate 200 may be formed using various other suitable technologies for forming a silicon base or substrate, such as a silicon single crystal wafer. Substrate 200 may be implemented, for example, with a bulk silicon, a silicon-on-insulator configuration (SOI), or with multi-layered structures, including those substrates upon which fins are formed prior to a subsequent gate patterning process. In other implementations, substrate 200 may be formed using alternate materials, which may or may not be combined with silicon, such as germanium. In a more general sense, any material that may serve as a foundation upon which a semiconductor device may be built can be used in accordance with embodiments of the present disclosure. Substrate 200 may also be considered a die for the purposes of this disclosure.

With further reference to FIG. 2, and as previously described, fins 210 and 220 were formed in substrate 200 after trench etch 102 was performed. Therefore, in this embodiment, fins 210 and 220 are formed on and from substrate 200. In other embodiments, fins 210 and 220 may be formed, grown, or produced by other suitable processes. For example, in some cases, fins 210 and 220 may be grown (e.g., epitaxially) from trenches formed in substrate 200. FIG. 2 also shows trench 215 formed between fins 210 and 220. Fins 210 and 220 can be formed using any suitable techniques, as will be apparent in light of this disclosure. For example, in some cases, trench etch 102 may include patterning and etching a thickness of substrate 200 using a resist or hardmask to form fins 210 and 220. In some such cases, multiple resist or hardmask layers may be used for the patterning materials. In some cases, trench etch 102 may include using an O2 or O2/Ar plasma etch at pressures in the 10-100 mTorr range, and at room temperature, for example.

As can be seen in FIG. 2, fins 210 and 220 are depicted as rectangular in shape for ease of description. However, the fins as variously described herein need not be so limited. For example, in other embodiments, the fins formed during trench etch 102 may have a rounded top, a triangular shape, or some other suitable fin shape as will be apparent in light of this disclosure. As will also be apparent in light of this disclosure, fins 210 and 220 may be used for n-type MOS devices (n-MOS), p-type MOS devices (p-MOS), or a CMOS device (e.g., where fin 210 will be an n-type MOS and fin 220 will be a p-type MOS), for example. Also note that although only two fins 210 and 220 (and trench 215 formed between) are shown for ease of description; however, it is contemplated that any number of similar fins and trenches may be formed on substrate 200 (e.g., hundreds of fins, thousands of fins, millions of fins, billions of fins, etc.) and benefit from the techniques described herein.

Figure 3:
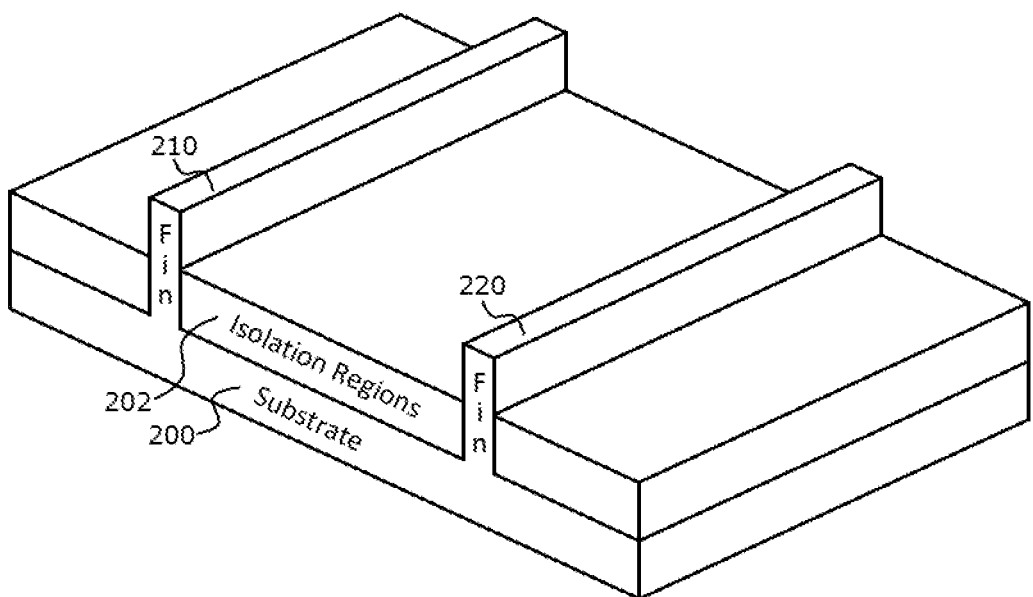
FIG. 3 illustrates a perspective view of the structure of FIG. 2 after depositing oxide material in the trenches and etching the trench oxide material to recess it below the level of the fins, in accordance with an embodiment

FIG. 3 illustrates a perspective view of the structure of FIG. 2 including shallow trench isolation (STI), provided by isolation regions 202, after depositing 103 insulator material in the trenches and etching the insulator material to recess it below the level of fins 210 and 220, in accordance with an embodiment. Deposition 103 to form isolation regions 202 may include atomic layer deposition (ALD), chemical vapor deposition (CVD), spin-on deposition (SOD), high-density plasma (HDP), plasma enhanced chemical deposition (PECVD), and/or some other suitable technique. In cases where patterning hardmask was used to form fins 210 and 220, the hardmask can be removed prior to depositing the trench oxide material. In some cases, the insulator or oxide material may be polished flat to the level of the top of fins 210 and 220, prior to etching the material to recess it below the level of fins 210 and 220. Isolation regions 202 may comprise, for example a dielectric, such as silicon dioxide (SiO2). However, the isolation regions 202 may be any insulator, oxide, or inter-layer dielectric (ILD) material which provides the desired amount of electrical isolation for a given target application or end-use, as will be apparent in light of this disclosure.

Figure 4:
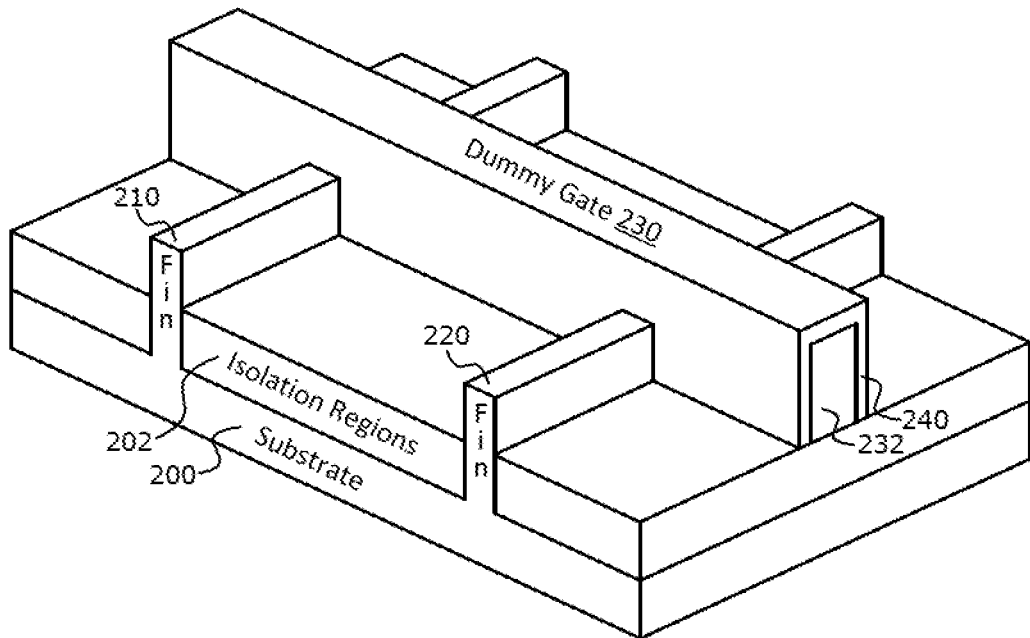
FIG. 4 illustrates a perspective view of the structure of FIG. 3 including a dummy gate after forming the same on the fins, in accordance with an embodiment

FIG. 4 illustrates a perspective view of the structure of FIG. 3 including dummy gate 230 after forming 104 the same on fins 210 and 220, in accordance with an embodiment. As previously described, the techniques disclosed herein for achieving multiple fin channel dimensions can be performed during the replacement gate process, which may also be known as a replacement metal gate (RMG) process. In this embodiment, dummy gate 230 can first be deposited by depositing a dummy gate dielectric/oxide and dummy gate electrode 232 (e.g., dummy polysilicon). The resulting structure can be patterned and spacer material 240 can be deposited and etched to form the structure shown in FIG. 4. Such depositions, patterning, and etching can be done using any suitable techniques, as will be apparent in light of this disclosure. Note that dummy gate oxide is not shown, because it is under the dummy electrode/polysilicon layer 232, in this example embodiment. Also note that dummy gate 230 is indicated on top of spacer material 240 for ease of reference and that dummy gate 230 (which includes dummy gate oxide and dummy electrode/polysilicon layer 232) as referred to herein may or may not include spacer material 240 when being discussed.

Figure 5:
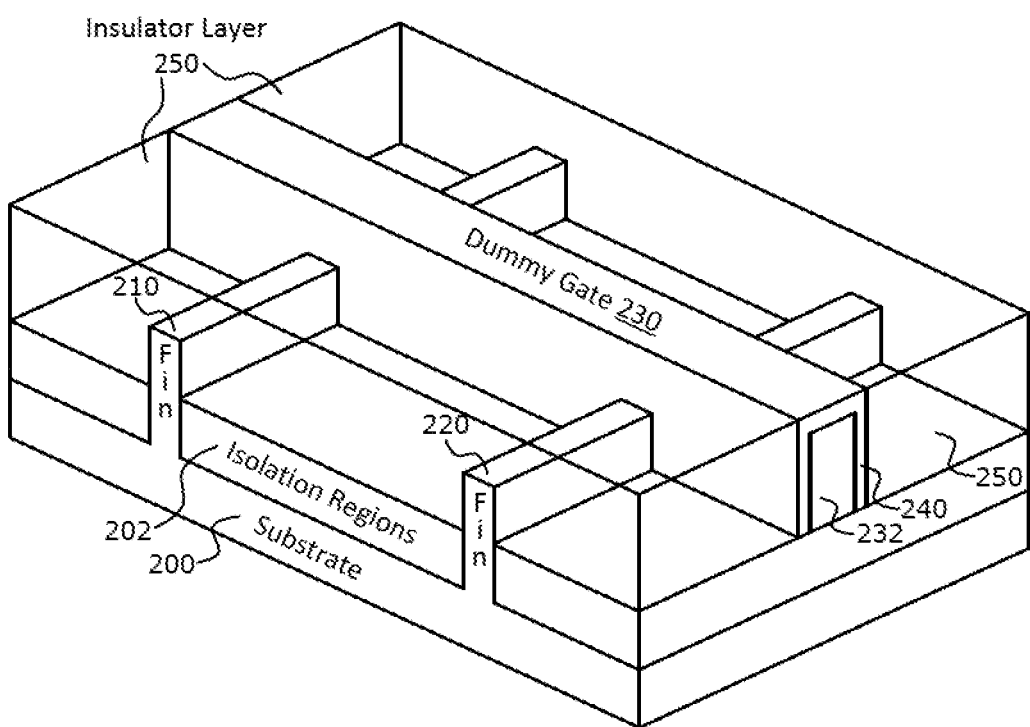
FIG. 5 illustrates a perspective view of the structure of FIG. 4 including an insulator layer after depositing the same and polishing the insulator layer to the top of the dummy gate, in accordance with an embodiment.

FIG. 5 illustrates a perspective view of the structure of FIG. 4 including insulator layer 250 after depositing 105 the same and polishing layer 250 to the top of dummy gate 230, in accordance with an embodiment. Insulator layer 250 may comprise any suitable filler material, including a dielectric material, such as SiO2, deposited by ALD, CVD, SOD, HDP, PECVD, and/or some other suitable technique, as will be apparent in light of this disclosure.

Figure 6:
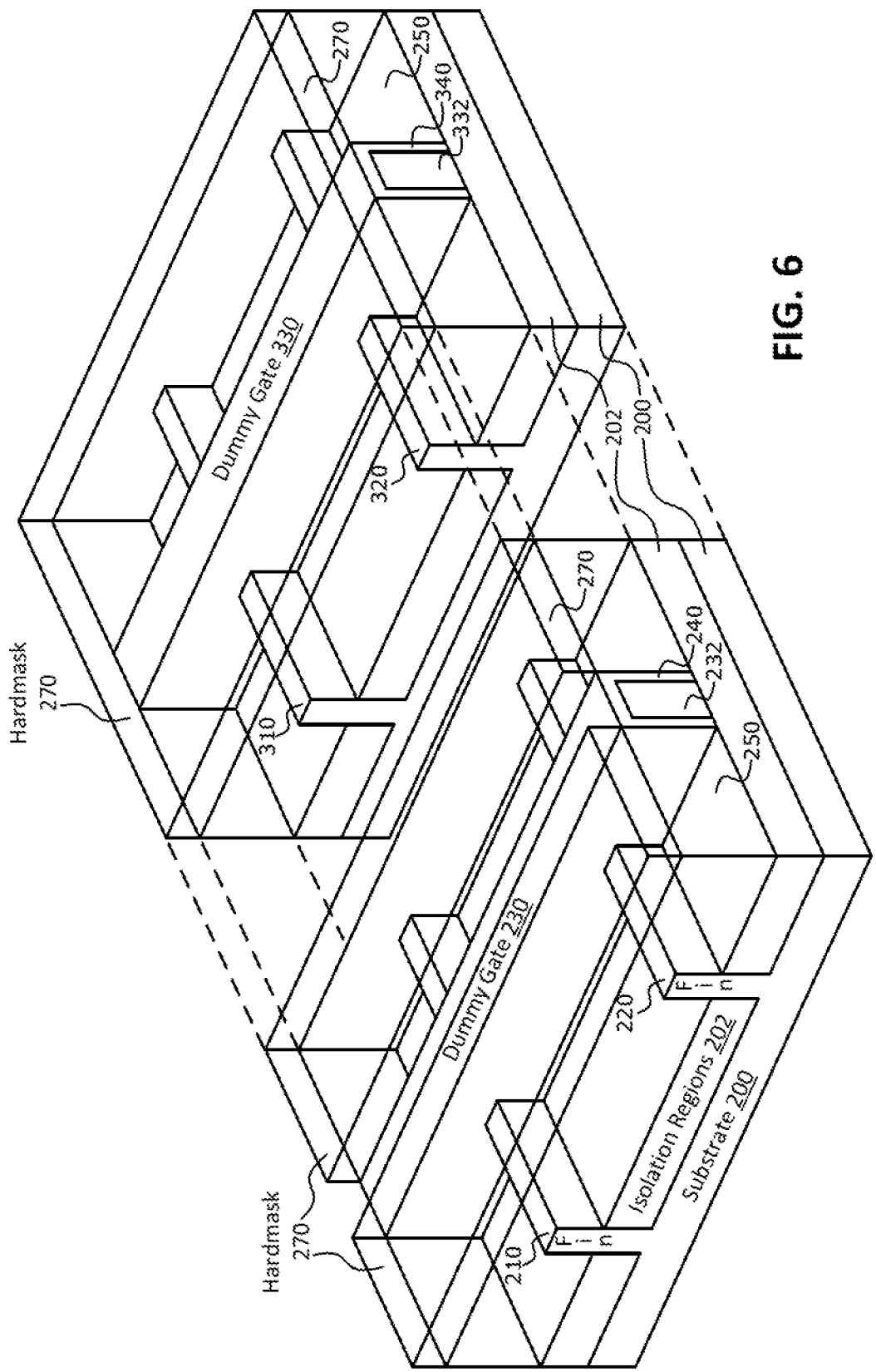
FIG. 6 illustrates a perspective view of the structure of FIG. 5 (including an additional area being processed on the substrate, including fins from the additional area) after lithographically defining an area to be opened, in accordance with an embodiment.

FIG. 6 illustrates a perspective view of the structure of FIG. 5 (including an additional area being processed on die/substrate 200, including fins 310 and 320) after lithographically defining 106 an area to be opened, in accordance with an embodiment. In this example embodiment, lithographically defining 106 the area to be opened includes a hardmasking and patterning process, resulting in the hardmask 270 pattern shown. Hardmask layer 270 can have any desired configuration and thickness, and in some instances, may be provided as a substantially conformal layer. Hardmask layer 270 can be formed, for example, using chemical vapor deposition (CVD), a spin-on process, and/or any other process suitable for providing a layer of hardmask material, as will be apparent in light of this disclosure. Also, in some embodiments, hardmask layer 270 can comprise, for example, a nitride, such as silicon nitride (Si3N4). However, hardmask layer 270 is not so limited in material composition, and in a more general sense, hardmask layer 270 may be any hardmask material having sufficient resilience for a given target application or end-use, as will be apparent in light of this disclosure.

After hardmask layer 270 has been formed, any suitable and/or custom patterning process can be utilized to pattern hardmask layer 270, as desired. In some embodiments, hardmask layer 270 may be patterned to open areas including dummy gates covering fins desired to be sculpted (as will be described below). As illustrated in the example embodiment shown in FIG. 6, hardmask layer 270 was patterned to open the area including dummy gate 230 (including dummy gate oxide 232). However, note that dummy gate 330 (including dummy gate oxide 332) covering the channel region of fins 310 and 320 was not opened during the patterning process of lithographically defining 106 the area to be opened, as will be discussed in more detail below. Any suitable area may be opened as desired via patterning of the hardmask layer to gain access to one or more dummy gates (each dummy gate covering the channel region of one or more fins), to achieve multiple fin channel dimensions on a single substrate/die 200, as will be apparent in light of this disclosure.

Figure 7A:
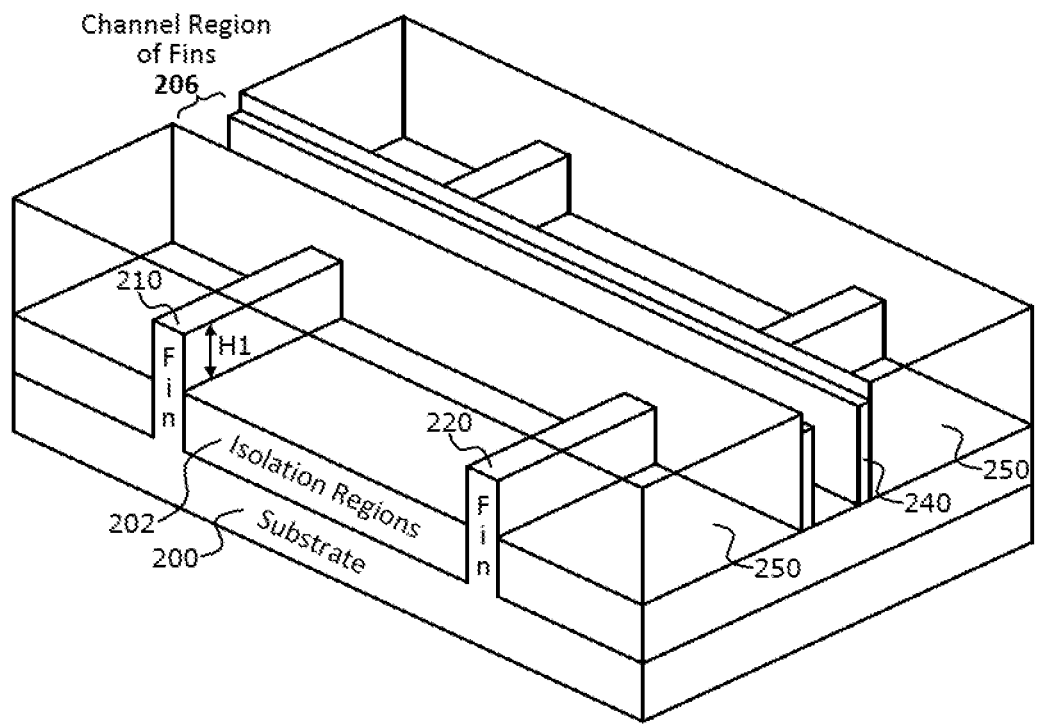
FIG. 7A illustrates a perspective view of the structure of FIG. 6 (excluding the additional area), after removing the dummy gate from the opened area to re-expose the channel region of the fins, in accordance with an embodiment.
Figure 7B:
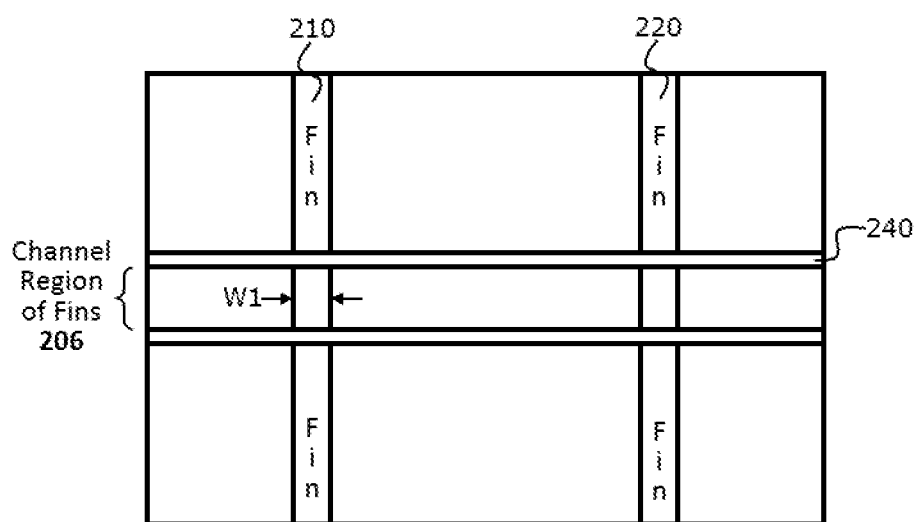
FIG. 7B illustrates a top planar view of the structure shown in FIG. 7A.

FIG. 7A illustrates a perspective view of the structure of FIG. 6 (excluding the additional area shown in FIG. 6 that included fins 310 and 320), after removing 107 dummy gate 230 to re-expose the channel region 206 of fins 210 and 220 (or what may become the channel region once the device is fully fabricated), in accordance with an embodiment. Removing 107 dummy gate 230, may include removing any capping layer (e.g., formed by spacer material 240) on top of the dummy gate, and then removing dummy gate electrode/poly-Si 232 and dummy gate oxide. Such removal may be done using any suitable etch, polish, and/or clean process, as will be apparent in light of this disclosure. Recall that removing 107 the dummy gate is only occurring for dummy gate 230 in this example embodiment (and not occurring for dummy gate 330 shown in FIG. 6, for example), as a result of the hardmasking and patterning process 106 performed to open the area containing dummy gate 230. FIG. 7B illustrates a top planar view of the structure shown in FIG. 7A. As can be seen in this top planar view, channel region 206 of fins 210 and 220 have been re-exposed. As can also be seen, and as will be discussed in more detail below, fins 210 and 220 each have a first width W1.

Figure 7C:
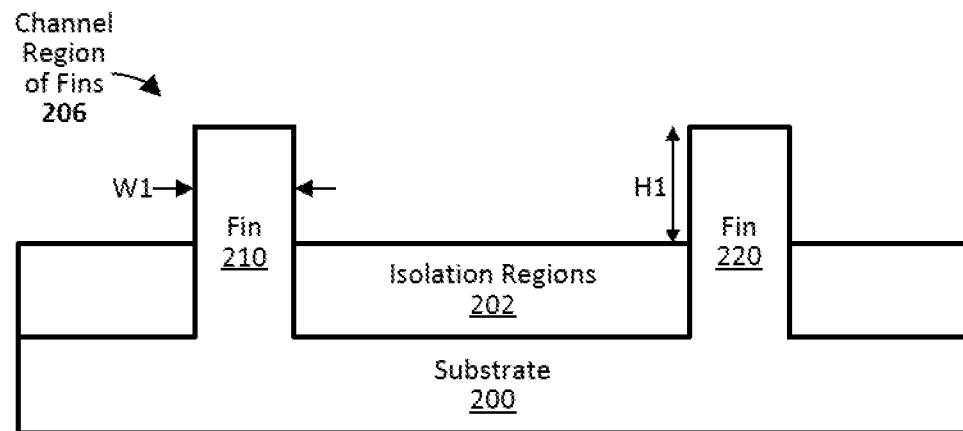
FIG. 7C illustrates a front cross-section view taken perpendicularly to the fins and across the channel region of the structure shown in FIG. 7A.

FIG. 7C illustrates a front planar view of only the channel region 206 of the structure shown in FIG. 7A. As can be seen in FIG. 7C, fins 210 and 220 each have a first width W1 and first height H1. Although fins 210 and 220 need not have the same initial width W1 and height H1, they are the same in this embodiment for ease of description. Note that first height H1 as used herein is the distance from the top of isolation region 202 to the top of the fins 210 and 220. Also note that the source and drain regions of fins 210 and 220 (or what may become the source and drain regions once the device is fully fabricated) start out with the same initial/first width W1 and height H1 as the channel region 206 of fins 210 and 220. For example, as can be seen in FIGS. 7A-B, the initial fin width W1 and height H1 is the same in the source/drain regions as it is in the channel region 206. In some embodiments, and as will be apparent in light of this disclosure, the first width W1 may be determined by trench etch 102, which was performed to form fins 210 and 220 in substrate 200.

Figure 8:
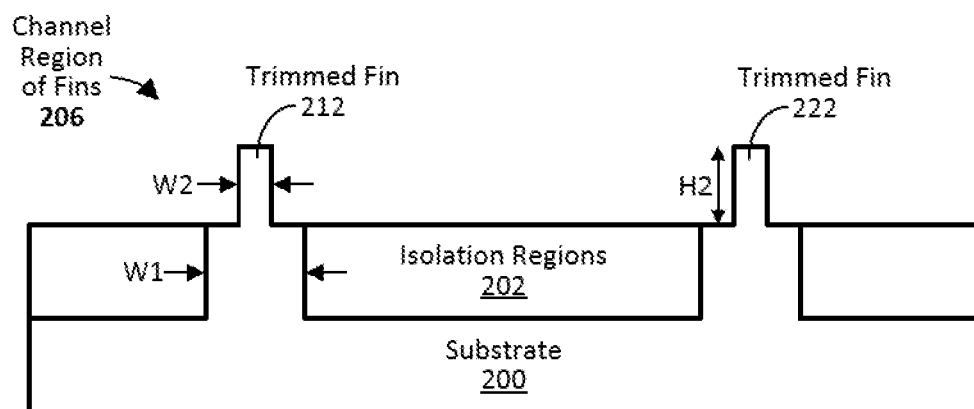
FIG. 8 continues from FIG. 7C and illustrates the resulting structure after performing a trim etch to achieve trimmed fins in the channel region, in accordance with an embodiment.

FIG. 8 continues from FIG. 7C and illustrates the resulting structure after performing trim etch 108 of the channel region 206 of fins 210 and 220 to achieve sculpted/trimmed fins 212 and 222, respectively, in accordance with an embodiment. In some embodiments, trim etch 108 may be performed using and/or inside of an epitaxial deposition tool or an epitaxial reactor. In some embodiments, trim etch may include, for example: 1) low ion energy plasma processing using chlorine (Cl) or fluorine (F) based chemistry or 2) thermal processing. In some embodiments, using Cl or F based chemistry may include using less than 5 kW (or less than 1 kW) of radio frequency energy, such as for between 10 and 40 seconds. In some embodiments, the low ion energy plasma processing may use an epitaxial deposition tool and a Cl based chemistry to achieve trim etch 108. One such example includes using low energy Cl containing plasma under the following conditions: 200 mT, 10 sccm C12, 100 sccm H2, 300 sccm Ar, 50 W, ion energy 2 eV, 20 seconds. In some embodiments, the thermal processing may employ epitaxial reactor or wafer chamber processing to achieve trim etch 108. In some embodiments, the thermal processing may employ an epitaxial deposition reactor with Cl2 in the temperature range of 500-700 degrees C. or HCl in the temperature range of 700-900 degrees C., such as for between 20 and 120 seconds, for example. One such example includes thermal processing under the following conditions: 750 degrees C., 100 sccm HCl, 10000 sccm H2, 20 T, 60 seconds. Any number of suitable etching processes may be used for trim etch 108 as will be apparent in light of this disclosure.

As can be seen in FIG. 8, trimmed fins 212 and 222 have each been sculpted/trimmed to second width W2 and second height H2, in this example embodiment. Recall that only the channel region 206 of fins 210 and 220 were sculpted/trimmed, resulting in trimmed fins 212 and 222. The source/drain regions of fins 210 and 220 are unaffected by trim etch 108 in this example embodiment, because they are covered by at least insulator layer 250 (e.g., as shown in FIGS. 7A-B). Note that the source/drain regions as well as the channel region of fins (e.g., fins 310 and 320 shown in FIG. 6) in unopened areas (e.g., areas left covered by hardmask layer 270 during the previous hardmask and patterning 106) are also unaffected by trim etch 108. In some embodiments, W2 may be equal to or less than W1. In some embodiments, H2 may be equal to or less than H1. In some embodiments, W1 may be greater than 15 nm and W2 may be 15 nm or less. In some embodiments, W1 may be between 1 nm and 15 nm greater than W2. In some embodiments, W1 may be between 2 nm and 6 nm greater than W2. In some embodiments, W1 may be greater than 10 nm (e.g., 15, 20, or 30 nm wide). In some embodiments, W2 may be 15 nm or less (e.g., 15, 10, or 7 nm wide). In some embodiments, W2 may be at least 5 nm. In some embodiments, H2 may be at least 20 nm. In some embodiments, H1 may be no more than 5 nm greater than H2. In some embodiments, it may be desirable to ensure that H2 is at least 20 nm after trim etch 108 is performed. Thus, in some embodiments, it may be desirable to start with fins having a high initial height H1 (e.g., at least 25, 30, 50, or 75 nm), to ensure a sufficient trimmed fin height H2 is remaining after trim etch 108. Note that, in this example embodiment, trimmed portions 212 and 222 of fins 210 and 220 are above isolation regions 202, and that the fins maintained their original width W1 in the portions next to or within isolation regions 202, as shown, for example, in FIG. 8.

Recall that although fins 210 and 220, as well as trimmed fin portions 212 and 222, are depicted as rectangular in shape, the disclosure need not be so limited. In some embodiments, where the fins have an irregular width from top to bottom, only a portion of the fins may be sculpted during trim etch 107. For example, in cases where the initially formed fins are tapered (e.g., where the top is thinner than the base), it may be desirable to primarily sculpt or only sculpt the bottom portion of the fin during trim etch 107. In such cases, the sculpting may be performed to achieve a more consistent width for the entirety of the channel portion of the fin. For example, trim etch 107 may be performed in such cases to shape the fins to be straight (rather than tapered). In another embodiment, the fin will have a saddle shape, such that the height and width are greatest at the edges of the channel where the fin meets the spacer sidewall. In such embodiments, in the center of the channel, the fin will be shorter and narrower. Other suitable configurations or variations for performing trim etch 107 will depend on a given application and will be apparent in light of this disclosure.

In a further embodiment, note that FIGS. 7C and 8 can also be viewed as respective cross-sections at two different locations of the same two fins, after the trim etch has been completed. For instance, the cross-section taken in FIG. 7C at the 210/220 location of the fins depicts a first fin height H1 and width W1, while the cross-section taken in FIG. 8 at the 212/222 location of those fins depicts a second fin height H2 and width W2. Any number of other mixed fin geometries will be apparent in light of this disclosure, whether on different fin sets, the same fin, or a combination thereof.

Method 101 of FIG. 1 may continue with repeating 109 processes 106 (lithographically defining area to be opened), 107 (removing dummy gate(s) from open area to re-expose channel region of fins in the open area), and 108 (performing a trim etch on the channel region of the fins in the open area) as desired, in accordance with one or more embodiments of the present disclosure. Processes 106, 107, and 108 can be performed once each, to achieve, for example, two sets of fins having different fin channel widths (e.g., as will be discussed below with reference to FIG. 9). However, processes 106, 107, and 108 may be repeated 109 as many times as desired to achieve a variety of fin channel dimensions on a given substrate/die and/or even at different locations along the same fin if so desired (e.g., CMOS device), as will be apparent in light of this disclosure. Note that when repeating lithographically defining 106 the area to be opened, any suitable area on the substrate/die 200 may be chosen. Also note that when repeating trim etch 108, different conditions may be used to sculpt the re-exposed fin channel regions as desired, such as in a manner listed above or any other suitable manner.

Figure 9:
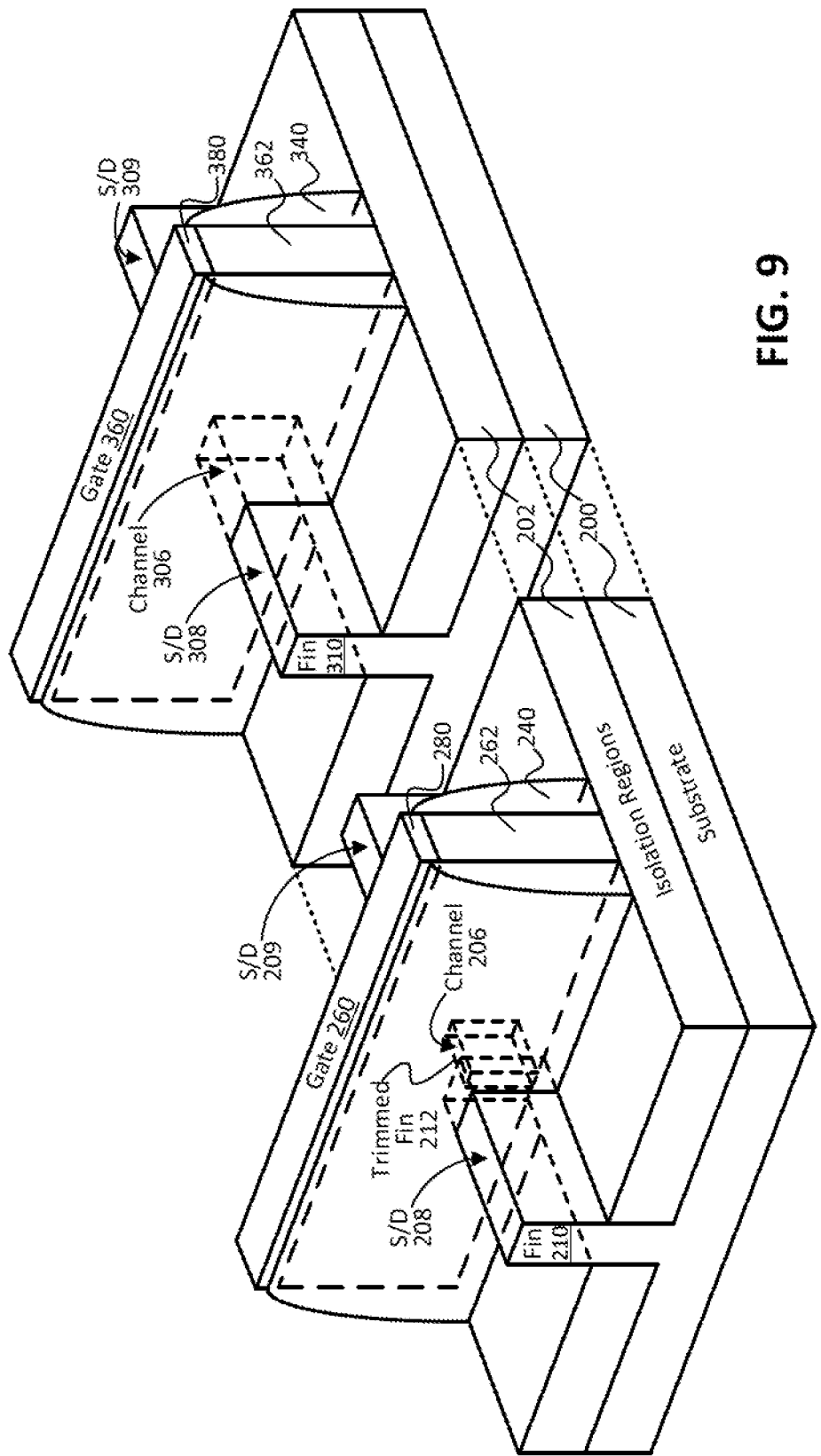
FIG. 9 illustrates a perspective view of the structure of FIG. 8 (including the additional area shown in FIG. 6) after additional processing to form semiconductor devices, in accordance with one or more embodiments.

Method 101 of FIG. 1 may optionally continue with forming 110 one or more semiconductor devices as is conventionally done, in accordance with some embodiments. For example, FIG. 9 illustrates a perspective view of the structure of FIG. 8 (including fin 310 from the additional area on die/substrate 200 shown in FIG. 6), after additional processing to form semiconductor devices (e.g., after completing the replacement gate process and performing source/drain contact trench etch), in accordance with one or more embodiments of the present disclosure. In this example embodiment, two finned transistors (e.g., a tri-gate or fin-FET) have been formed. As can be seen in FIG. 9, fins 210 and 310 are shown for illustrative purposes, and fin 210 is trimmed 212 in the channel region 206. As can also be seen, fin 210 maintained first width W1 in the source/drain regions 208 and 209, and fin 310 has a consistent width (W3) throughout its source/drain regions 308 and 309 and its channel region 306. In other words, the source/drain regions 208 and 209 of fin 210 and the entirety of fin 310 were unaffected by trim etch 108, since trim etch 108 was performed when only the channel region 206 of fins 210 and 220 were exposed. As a result, the adjacent resistance paths through the source/drain regions 208 and 209 of fin 210 (as well as any related tip regions and the contacts) may all be relatively lower (e.g., compared to the resistance paths through source/drain regions 308 and 309) due to the physically wider dimension of the fin in the source/drain regions as compared to the trimmed portion 212 of fin 210 in the channel region 206.

In some embodiments, the width W3 of fin 310 may be equal to or substantially similar (e.g., within 1 or 2 nm) to W1. In a more general sense, W1 and W2 may represent the width in the source/drain regions and the channel region, respectively of each fin in a first set of fins, where the first set of fins were selectively trimmed according to method 101. W3 may represent the width in all regions (source/drain and channel) of all remaining fins, which may constitute a second set of fins. As previously described, the selective sculpting/trimming of an area of fins may be repeated 109 as many times as desired. Therefore, any number of sets of fins (e.g., 3, 4, 5, . . . n sets) may be formed on a given substrate/die using the techniques described herein to achieve a variety of fin channel dimensions. In some embodiments, the channel region of all of the sets of fins may be sculpted/trimmed to some degree (relative to the source/drain regions of those fins). Therefore, in some embodiments, the fin channel width of all fins on a given substrate/die may be less than the fin width in corresponding source/drain regions. Note that, in this example embodiment, source/drain regions 208/209 and 308/309 are shown as a part of the original fins 210 and 310, respectively formed on and from substrate 200. However, the present disclosure need not be so limited. For example, in some embodiments, any and/or all source/drain regions may be removed and replaced with another material, and therefore, some or all of the source/drain regions may have no portion of the original fins in them. In other embodiments, any and/or all of the source/drain regions of the fins may also undergo thinning, sculpting, reshaping, cladding, and/or other various suitable processes. Therefore, in some embodiments, the width of the fin portion in the source/drain regions may not be equivalent to the original fin width (e.g., width W1 shown in FIGS. 7C and 8).

With further reference to FIG. 9, gate electrodes 262 and 362 were deposited/formed to replace dummy gate electrodes 232 and 332, respectively, in this embodiment, and optional gate dielectric (not shown) may be formed directly under gate electrodes 262 and 362, as conventionally done. As can also be seen, spacers 240 and 340 are formed around gates 260 and 360, respectively, and gates 260 and 360 also have hardmask 280 and 380 formed thereon (which may be removed to form a metal gate contact). Gate electrodes 262 and 362 and gate dielectric may be formed using any suitable technique and from any suitable materials. For example, replacement gates 260 and 360 can be formed using any of a wide variety of processes, including CVD, physical vapor deposition (PVD), a metal deposition process, and/or any combination thereof. In some embodiments, gate electrodes 262 and 362 may comprise any of a wide range of materials, such as polysilicon or various suitable metals (e.g., aluminum (Al), tungsten (W), titanium (Ti), copper (Cu), or any other suitable metal or alloy). Other suitable configurations, materials, and processes for forming a replacement gate or replacement metal gate (RMG) will depend on a given application and will be apparent in light of this disclosure.

With further reference to FIG. 9, an etching process (e.g., any suitable wet or dry etching process) was performed to expose the source/drain regions 208, 209 and 308, 309 of fins 210 and 310, respectively, as shown. Method 101 to form an integrated circuit device may include additional or alternative processes as will be apparent in light of this disclosure. For example, the method may continue with source/drain processing and may include the deposition of source/drain metal contacts or contact layers. Such metallization of the source and drain contacts can be carried out using a silicidation process (generally, deposition of contact metal and subsequent annealing). For instance, silicidation with nickel, aluminum, nickel-platinum or nickel-aluminum or other alloys of nickel and aluminum, or titanium with or without germanium pre-amorphization implants can be used to form a low resistance germanide.

In some embodiments, the principles and techniques as variously described herein may be used to sculpt/trim the entirety of fins in an opened area, before gates (or dummy gates) are deposited. For example, this may include lithographically defining (e.g., hardmasking and patterning) an area to be sculpted/trimmed and then performing a trim etch to sculpt/trim the fins in the area, before gates are deposited. In such embodiments, the dimensions of each fin from the sculpted/trimmed area would be the same in both the source/drain regions and the channel region. The processes for selectively sculpting/trimming an area of fins can be repeated as many times as desired to achieve a variety of fin dimensions on a given substrate/die.

As previously mentioned, method 101 and the structures shown in FIGS. 2-9 are depicted and described herein in the context of finned transistor configurations (e.g., tri-gate or finFET) having varying channel dimensions, for ease of illustration. However, the principles and techniques as variously described herein may be used for forming other semiconductor devices and transistor configurations on a single die having multiple fin dimensions, including, for example, planar, dual-gate, gate-all-around (e.g., nanowire/nanoribbon), and other suitable devices and configurations. Also recall that the structures described herein may be used for the formation of p-MOS, n-MOS, or CMOS transistor devices, depending upon the particular configuration. Numerous variations and configurations will be apparent in light of this disclosure.

Example System

Figure 10:
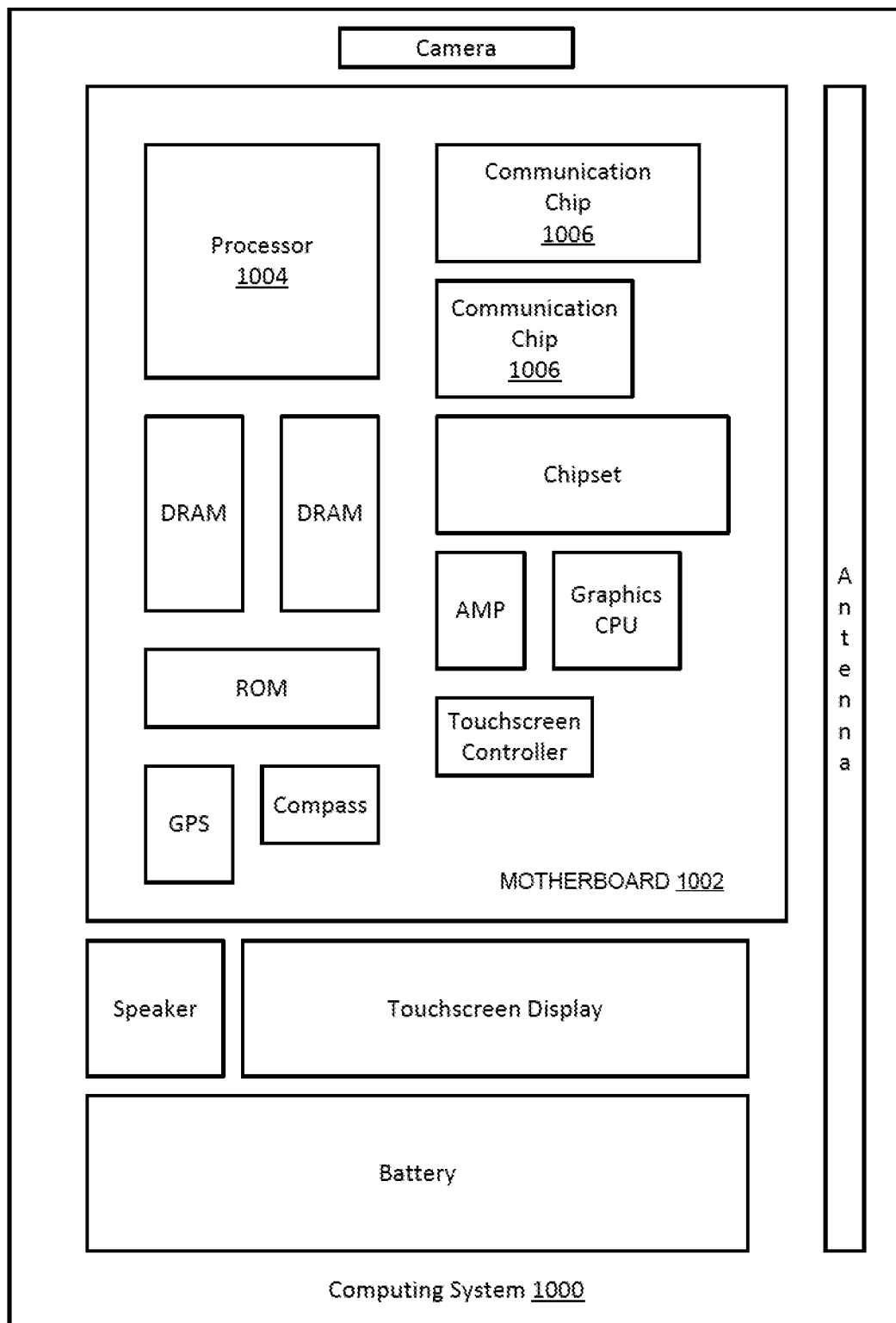
FIG. 10 illustrates a computing system implemented with one or more integrated circuits configured in accordance with one or more embodiments of the present disclosure.

FIG. 10 illustrates a computing system 1000 implemented with one or more integrated circuits configured in accordance with one or more embodiments of the present disclosure. As can be seen, the computing system 1000 houses a motherboard 1002. The motherboard 1002 may include a number of components, including but not limited to a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as a hard disk drive, compact disk (CD), digital versatile disk (DVD), and so forth). Any of the components included in computing system 1000 may include one or more integrated circuit structures as variously described herein (e.g., including multiple fin dimensions, particularly in the channel region of the fins). These integrated circuit structures can be used, for instance, to implement system-on-chip (SOC) devices, which may include an at least one of a microprocessor, a microcontroller, memory, and a power management circuit, for example. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as NFC, Wi-Fi, and Bluetooth, and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard memory circuitry that is implemented with one or more semiconductor or transistor structures as variously described herein (e.g., where multiple fin dimensions are used on the single die to achieve finned transistor structures having varying channel dimensions). The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip includes one or more devices implemented with one or more transistor structures as variously described herein (e.g., on-chip processor or memory). As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs one or more integrated circuit structures or devices as variously described herein.

Further Example Embodiments

The following examples pertain to further embodiments, from which numerous permutations and configurations will be apparent.

Example 1 is an integrated circuit comprising: a first set of one or more fins formed on and from a substrate, the first set of fins each having source/drain regions and a channel region, wherein the first set of fins each have a first width (W1) in the source/drain regions and a second width (W2) in the channel region, and wherein W2 is less than W1; and a second set of one or more fins formed on and from the substrate, the second set of fins each having source/drain regions and a channel region, wherein the second set of fins each have a third width (W3) in the source/drain regions and the channel region.

Example 2 includes the subject matter of Example 1, wherein: at least one of the fins in the first or second sets has a first channel height at a first location on the fin and a second channel height at a second location on the fin; and/or at least one of the fins in the first set has a first channel height and one of the fins in the second set has a second channel height; wherein the first and second channel heights comprise intentionally different channel heights.

Example 3 includes the subject matter of any of Examples 1-2, wherein W1 is greater than 15 nm and W2 is 15 nm or less.

Example 4 includes the subject matter of any of Examples 1-3, wherein W1 is between 2 nm and 6 nm greater than W2.

Example 5 includes the subject matter of any of Examples 1-4, wherein W2 is at least 5 nm.

Example 6 includes the subject matter of any of Examples 1-5, wherein W3 is substantially similar to W1.

Example 7 includes the subject matter of Example 6, wherein substantially similar means within 1 nm.

Example 8 includes the subject matter of any of Examples 1-7, wherein the second set of fins have substantially different widths in the source/drain regions as compared to the channel region.

Example 9 includes the subject matter of any of Examples 1-8, wherein the first set of fins and the second set of fins each have at least one semiconductor device built thereon.

Example 10 includes the subject matter of Example 9, wherein the semiconductor devices are p-MOS, n-MOS, or CMOS transistor devices.

Example 11 includes the subject matter of any of Examples 1-10, further comprising a third set of fins formed on and from the substrate, the third set of fins each having source/drain regions and a channel region, wherein the third set of fins each have a fourth width (W4) in the source/drain regions and a fifth width (W5) in the channel region.

Example 12 includes the subject matter of Example 11, wherein W5 is not equal to W2.

Example 13 includes the subject matter of any of Examples 1-12, wherein the integrated circuit is a system-on-chip (SOC) device.

Example 14 includes a mobile computing system comprising the subject matter of any of Examples 1-13.

Example 15 is a method of forming an integrated circuit, the method comprising: performing a trench etch to form fins and trenches in a substrate, wherein each fin has a first width (W1); depositing an insulator material in the trenches; forming dummy gates on channel regions of the fins; depositing an additional insulator layer over topography of the fins and dummy gates; lithographically defining a first area to be opened; removing the dummy gate in the first area to re-expose the channel region of the fins in the first area; and performing a first trim etch on the channel region of the fins in the first area, wherein the trimmed channel region of each fin in the first area has a second width (W2), and wherein W2 is less than W1.

Example 16 includes the subject matter of Example 15, further comprising repeating the processes of lithographically defining an area to be opened, removing the dummy gate in that area to re-expose the channel region of the fins in that area, and performing a trim etch on the channel region of the fins in that area to achieve fins having channel regions of varying dimensions.

Example 17 includes the subject matter of any of Examples 15-16, further comprising: removing the dummy gate in the second area to re-expose the channel region of the fins in the second area; and performing a second trim etch on the channel region of the fins in the second area, wherein the trimmed channel region of each fin in the second area has a third width (W3), and wherein W3 is less than W1.

Example 18 includes the subject matter of any of Examples 15-17, wherein lithographically defining comprises forming a hardmask layer and patterning the area to be opened.

Example 19 includes the subject matter of any of Examples 15-18, wherein performing a trim etch comprises at least one of low ion energy plasma processing using chlorine based chemistry and thermal processing.

Example 20 includes the subject matter of any of Examples 15-19, wherein performing a trim etch comprises using chlorine based chemistry and using less than 5 kW of radio frequency energy for between 10 and 40 seconds.

Example 21 includes the subject matter of any of Examples 15-20, wherein performing a trim etch comprises using chlorine based chemistry and using less than 1 kW of radio frequency energy for between 10 and 40 seconds.

Example 22 includes the subject matter of any of Examples 15-19, wherein performing a trim etch comprises using thermal processing and using less than 900 degrees C. heat in an epitaxial reactor for between 20 and 120 seconds in the presence of HCl.

Example 23 includes the subject matter of any of Examples 15-19, wherein performing a trim etch comprises using thermal processing and using less than 700 degrees C. heat in an epitaxial reactor for between 20 and 120 seconds in the presence of Cl2.

Example 24 includes the subject matter of any of Examples 15-23, wherein the substrate material comprises silicon (Si).

Example 25 includes the subject matter of any of Examples 15-24, wherein W1 is greater than 15 nm and W2 is 15 nm or less.

Example 26 includes the subject matter of any of Examples 15-25, wherein W1 is between 2 nm and 6 nm greater than W2.

Example 27 includes the subject matter of any of Examples 15-26, wherein W1 is greater than 10 nm.

Example 28 includes the subject matter of any of Examples 15-27, wherein W2 is at least 5 nm.

Example 29 includes the subject matter of any of Examples 17-28, wherein W3 not equal to W2.

Example 30 includes the subject matter of any of Examples 17-29, further comprising forming at least one semiconductor device on fins in the first area, fins in the second area, and/or fins not in the first or second areas.

Example 31 includes the subject matter of Example 30, wherein the one or more semiconductor devices are p-MOS, n-MOS, or CMOS transistor devices.

Example 32 includes an apparatus comprising means for performing the subject matter of any of Examples 15-29.

Example 33 includes an integrated circuit comprising: a first set of one or more transistors including finned channel regions formed on and from a substrate; and a second set of one or more transistors including finned channel regions formed on and from the substrate; wherein, above isolation regions, at least one of the height and width dimensions of the first set of channel regions is different than the corresponding dimension of the second set of channel regions.

Example 34 includes the subject matter of Example 33, wherein the first set of channel regions has a first width (W1) within isolation regions and a second width (W2) above the isolation regions, and W2 is less than W1.

Example 35 includes the subject matter of Example 34, wherein W1 is greater than 15 nm and W2 is 15 nm or less.

Example 36 includes the subject matter of any of Examples 34-35, wherein W1 is between 2 nm and 6 nm greater than W2.

Example 37 includes the subject matter of any of Examples 33-36, wherein, above isolation regions, the width of the first set of channel regions is less than the width of the second set of channel regions.

Example 38 includes the subject matter of any of Examples 33-36, wherein, above isolation regions, the height of the first set of channel regions is less than the width of the second set of channel regions.

Example 39 includes the subject matter of any of Examples 33-36, wherein, above isolation regions, the width and height of the first set of channel regions is less than the width and height, respectively, of the second set of channel regions.

Example 40 includes the subject matter of any of Examples 33-39, wherein the transistors are p-MOS, n-MOS, and/or CMOS transistors.

Example 41 includes a system-on-chip (SOC) device comprising the subject matter of any of Examples 33-40.

Example 42 includes the subject matter of Example 41, further comprising at least one of a microprocessor, a microcontroller, memory, and a power management circuit.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit including at least one transistor device, the integrated circuit comprising:
    a first fin including semiconductor material, the first fin having adjacent first and second sections, the first section of the first fin having an upper portion and a lower portion, the lower portion of the first section of the first fin between insulator material;
    a first gate structure over the first section of the first fin, the first gate structure comprising a first gate dielectric and a first gate electrode, the upper portion of the first section of the first fin laterally between portions of the first gate structure;
    a first gate spacer over the second section of the first fin;
    a second fin including semiconductor material, the second fin having adjacent third and fourth sections, the third section of the second fin having an upper portion and a lower portion, the lower portion of the third section of the second fin between insulator material, wherein the upper portion of the third section of the second fin is continuous with the upper portion of the first section of the first fin;
    a second gate structure over the third section of the second fin, the second gate structure comprising a second gate dielectric and a second gate electrode, the upper portion of the third section of the second fin laterally between portions of the second gate structure; and
    a second gate spacer over the fourth section of the second fin;
    wherein a height of the upper portion of the first section of the first fin is greater than a height of the upper portion of the third section of the second fin.

2. The integrated circuit of claim 1, wherein the first fin extends from a substrate and the second fin extends from the substrate.

3. The integrated circuit of claim 2, wherein the substrate, the first fin, and the second fin all include silicon.

4. The integrated circuit of claim 1, wherein the first and second fins are tapered, such that the upper portion of the first section of the first fin is thinner than the lower portion of the first section of the first fin, and the upper portion of the third section of the second fin is thinner than the lower portion of the third section of the second fin.

5. The integrated circuit of claim 1, wherein widths of the lower portions of the first and third sections of the first and second fins, respectively, are greater than 15 nm.

6. The integrated circuit of claim 1, wherein widths of the upper portions of the first and third sections of the first and second fins, respectively, are 15 nm or less.

7. The integrated circuit of claim 1, wherein the first gate dielectric is between the first gate electrode and the upper portion of the first section of the first fin, and the second gate dielectric is between the second gate electrode and the upper portion of the third section of the second fin.

8. The integrated circuit of claim 7, wherein the first gate electrode includes one or more metals, and the second gate electrode includes one or more metals.

9. The integrated circuit of claim 1, further comprising:
a first transistor including the first gate structure and the upper portion of the first section of the first fin; and
a second transistor including the second gate structure and the upper portion of the third section of the second fin.

10. The integrated circuit of claim 9, wherein the first transistor further includes a first source region and a first drain region, the upper portion of the first section of the first fin laterally between the first source and drain regions, and the second transistor further includes a second source region and a second drain region, the upper portion of the third section of the second fin laterally between the second source and drain regions.

11. A computing device, comprising:
a board; and
a component coupled to the board, the component including an integrated circuit structure, comprising:
a first fin including semiconductor material, the first fin having adjacent first and second sections, the first section of the first fin having an upper portion and a lower portion, the lower portion of the first section of the first fin between insulator material;
a first gate structure over the first section of the first fin, the first gate structure comprising a first gate dielectric and a first gate electrode, the upper portion of the first section of the first fin laterally between portions of the first gate structure;
a first gate spacer over the second section of the first fin;
a second fin including semiconductor material, the second fin having adjacent third and fourth sections, the third section of the second fin having an upper portion and a lower portion, the lower portion of the third section of the second fin between insulator material, wherein the upper portion of the third section of the second fin is continuous with the upper portion of the first section of the first fin;
a second gate structure over the third section of the second fin, the second gate structure comprising a second gate dielectric and a second gate electrode, the upper portion of the third section of the second fin laterally between portions of the second gate structure; and
a second gate spacer over the fourth section of the second fin;
wherein a height of the upper portion of the first section of the first fin is greater than a height of the upper portion of the third section of the second fin.

12. The computing device of claim 11, further comprising:
a memory coupled to the board.

13. The computing device of claim 11, further comprising:
a communication chip coupled to the board.

14. The computing device of claim 11, further comprising:
a camera coupled to the board.

15. The computing device of claim 11, wherein the component is a packaged integrated circuit die.

16. The computing device of claim 11, wherein the first fin extends from a substrate and the second fin extends from the substrate.

17. The computing device of claim 16, wherein the substrate, the first fin, and the second fin all include silicon.

18. The computing device of claim 11, wherein the first and second fins are tapered, such that the upper portion of the first section of the first fin is thinner than the lower portion of the first section of the first fin, and the upper portion of the third section of the second fin is thinner than the lower portion of the third section of the second fin.

19. The computing device of claim 11, wherein the first gate dielectric is between the first gate electrode and the upper portion of the first section of the first fin, and the second gate dielectric is between the second gate electrode and the upper portion of the third section of the second fin.

20. The computing device of claim 19, wherein the first gate electrode includes one or more metals, and the second gate electrode includes one or more metals.

* * * * *